United States Patent [19]

Allen et al.

[11] 4,265,986

[45] May 5, 1981

[54] PHOTOPOLYMERIZABLE COMPOSITION CONTAINING CHLOROSULFONATED POLYETHYLENE

[75] Inventors: Deborah L. Allen, Waterbury; Milton Farber, Bethany; John D. Skewis, Roxbury, all of Conn.

[73] Assignee: Uniroyal, Inc., New York, N.Y.

[21] Appl. No.: 96,608

[22] Filed: Nov. 21, 1979

[51] Int. Cl.³ .............................................. G03C 1/68
[52] U.S. Cl. ...................................... 430/18; 430/281; 430/306; 430/907; 430/288; 204/159.15; 204/159.16; 204/159.17
[58] Field of Search ................. 430/281, 306, 18, 907, 430/286, 288; 204/159.15, 159.16, 159.17

[56] References Cited

U.S. PATENT DOCUMENTS

| | | | |
|---|---|---|---|
| 2,760,863 | 8/1956 | Plambeck | 430/281 |
| 3,024,180 | 3/1962 | McGraw | 204/163 |
| 3,764,324 | 10/1973 | Reyes | 430/306 |
| 4,023,973 | 5/1977 | Imaizumi et al. | 204/159.15 |
| 4,045,231 | 8/1977 | Toda et al. | 204/159.17 |
| 4,058,443 | 11/1977 | Murata et al. | 204/159.18 |
| 4,162,919 | 7/1979 | Richter et al. | 430/281 |

OTHER PUBLICATIONS

Maynard et al., Rubber Chemistry and Technology, Oct.-Nov. 1963, vol. XXXVI, No. 4, p. 963.
Rubber World Bluebook, p. 13, 1979, (Kovach, publisher).

*Primary Examiner*—Jack P. Brammer
*Attorney, Agent, or Firm*—Thomas A. Beck

[57] ABSTRACT

A photopolymer elastomeric article designed to be used primarily in a flexographic printing system comprising three constituents: a chlorosulfonated polyethylene polymer matrix, a photopolymerizable, ethylenically unsaturated crosslinking agent, as typified by esters of acrylic or methacrylic acid and a photoinitiator, which is a compound, which when irradiated, will initiate polymerization and/or crosslinking.

39 Claims, No Drawings

PHOTOPOLYMERIZABLE COMPOSITION CONTAINING CHLOROSULFONATED POLYETHYLENE

BACKGROUND OF THE INVENTION

1. Field of the Invention

The present invention relates to a photopolymer elastomeric article which is designed to be used primarily in a flexographic printing system. Flexographic printing is a method of rotary letterpress printing which employs flexible elastomer printing plates. In this system the ink is transferred directly from the raised surfaces of the elastomeric plate to the printing stock.

Flexible photopolymer printing plates of the present invention comprise three elements:
1. An elastomeric polymer matrix,
2. A photopolymerizable, ethylenically unsaturated crosslinking agent, as typified by esters of acrylic or methacrylic acid and
3. A photoinitiator, which is a compound, which when irradiated, will initiate polymerization and/or crosslinking.

The chemical nature of these three elements may be varied and additional components added as needed to improve plate production and performance characteristics, especially printing quality. The ability of the polymer matrix to accept such additives is of great advantage as photopolymer plates are being used in many different types of printing requiring distinctly different properties. Those properties most desirable in flexible photopolymer plates include solvent resistance, wide choice of durometer (hardness), short plate processing time, resistance to cracking, and resistance to postcuring. The current invention combines more of these desirable qualities than any in the prior art, and involves the use of a chlorosulfonated polyethylene or blends thereof as the polymer matrix.

2. Description of the Prior Art

U.S. Pat. No. 2,760,863 discloses a process to make relief images from a photopolymerizable system containing a polymeric thickener or filler, an addition polymerizable monomer, and a photopolymerization initiator.

U.S. Pat. No. 3,024,180 and Canadian 614,181 disclose relief plates based on polymers of 1,3-butadiene and halogen-substituted 1,3-butadiene, and mentions copolymers thereof, with aryl olefins, e.g. styrene, acrylic esters and nitriles.

U.S. Pat. No. 3,674,486 discloses printing plate compositions based on block copolymers of styrene and polybutadiene (SBS) or polyisoprene (SIS).

U.S. Pat. No. 3,764,324 discloses a printing plate formulation consisting of an unsaturated polymer including butadiene or acrylonitrile, and a saturated polymer including butadiene or acrylonitrile, and a saturated halogenated polymer, such as polyvinylchloride, which result in a hard, solvent resistant plate.

None of these references disclose a flexible photopolymer plate in which the polymer matrix is chlorosulfonated polyethylene.

SUMMARY OF THE INVENTION

The present invention is a flexible photopolymer printing plate comprising: (1) a chlorosulfonated polyethylene elastomer, or blends thereof, (2) a photopolymerizable, ethylenically unsaturated crosslinking agent, and (3) an addition polymerization initiator activatable by actinic radiation.

The article of the present invention, comprising a layer of the aforesaid photopolymerizable composition optionally adhered to a backing layer, is exposed to actinic radiation through an image-bearing process transparency, consisting of substantially clear and opaque areas, placed in intimate contact with the photopolymerizable layer. Irradiation causes insolubilization in the area of the layer underneath the clear area of the process transparency, but substantially no insolubilization occurs in the unexposed areas underneath the opaque areas of the process transparency. After this irradiation, the article is treated with a solvent such as a halogenated hydrocarbon, which removes the unexposed soluble areas of the plate. The resulting relief surface can now be used for printing, either as a plate, or in sleeve form.

DESCRIPTION OF THE PREFERRED EMBODIMENTS OF THE INVENTION

As noted, flexible photopolymer printing plates comprise three major elements: (1) An elastomeric polymer matrix; (2) A photopolymerizable ethylenically unsaturated cross-linking agent as typified by esters of acrylic or methacrylic acid; (3) A photoinitiator, which is a compound, which when irradiated, will initiate polymerization and/or crosslinking. In the present invention the elastomeric polymer matrix is a chlorosulfonated polyethylene, or a blend thereof. The chlorosulfonated polyethylenes operable in this invention are described in Rubber World 1979 Blue Book, Materials, Compounding Ingredients, and Machinery for Rubber, page 343. They are designated CSM and have specific gravities of 1.14, 1.18, 1.11, and 1.26 and Mooney viscosities, ML-4, at 212° F., of 30, 55, 40, 77, respectively. These synthetic rubbers are available under the tradename Hypalon and the code numbers 20, 40, 45, 48. These polymers contain from about 25% to 43% chlorine and 1.0% to about 1.5% sulfur based upon the weight of the polymer, preferably 25% to 35% chlorine and 1.0% to 1.5% sulfur contents.

It is known from the prior art that systems which are crosslinked by a free radical mechanism are essential for photopolymer printing plates because the curing process involved is triggered by ultraviolet irradiation to form a radical species. Hypalon, however, is not a likely choice for this application because in all curing processes for Hypalon, free radicals are avoided. In fact, as set forth in the Hypalon Report No. 13, Rubber Chemistry and Technology, October-November 1963 it is stated that in the sulfur-free metal oxide curing systems for Hypalon which involve ionic crosslinking, free radical scavengers are introduced to shield the sulfonyl chloride groups of Hypalon against decomposition by radicals. Loss of sulfonyl chloride cure sites, according to Hypalon Report No. 13, would prevent efficient formation of the metal sulfonate crosslinks needed for proper cure of the Hypalon. The concept, therefore, that Hypalon, or blends thereof, would be suitable for a free radial photochemically curing article is wholly unexpected.

The chlorosulfonated polyethylenes are uniquely suited for the flexible printing plate application in that they offer resistance to hydrocarbon solvents, which is a chief advantage of nitrile rubber plates, as well as shorter processing times, an advantage of SBS and SIS block copolymer plates. The CSM based plates have good solvent resistance, no tendency to crack, good copy resolution, ozone resistance preventing post cure, good color stability with age, and high abrasion resistance. CSM is compatible with SBS and SIS block copolymers, nitrile rubbers, polybutadienes, unsaturated esters used as monomers, photoinitiators, fillers such as silica and processing aids such as Struktols 60 NS and WB 212 made by Struktol Company of America and described in *Rubber World* 1979 *Blue Book*, page 124 and page 172. This compatibility enables CSM, in blends, to combine the advantages of the major printing plates based on other polymers, but with fewer deficiencies. The CSM is workable at a low temperature, preventing monomer degradation.

The polymers which may be blended with CSM include natural and synthetic dienoid elastomers and chlorinated hydrocarbon elastomers. Synthetic elastomers include homopolymers of conjugated diolefin hydrocarbons and copolymers of such diolefins with mono-olefinic compounds copolymerizable therewith. Such mono-olefins include styrene, alpha-methylstyrene, p-methylstyrene, alpha-p-dimethylstyrene, acrylic and methacrylic nitriles, amides, acids and esters, vinylpyridines, fumaric esters, methylenemalonic esters, vinylidene chloride, methyl vinyl ketone and methyl isopropenyl ketone. Mixtures of such mono-olefinic compounds can also be polymerized with the diolefin. Of particular usefulness in blends with the CSM are butadiene-acrylonitrile copolymers as prepared by the method described in U.S. Pat. No. 1,937,000, butadiene-styrene copolymers and block copolymers of butadiene or isoprene with styrene of the SBS and SIS types as prepared by the method described in U.S. Pat. No. 3,265,765, and chlorinated polyethylene.

In order to maintain elastomeric properties, these copolymers should comprise at least 50% by weight of diene. In the case of nitrile rubber, the copolymer contains 2 to 50% by weight of the copolymerized acrylonitrile (preferably 20 to 40% by weight) the balance comprising 1,3-butadiene.

In a styrene-butadiene copolymer rubber, the copolymer contains 21 to 45% of the copolymerized styrene. In a styrene-butadiene or styrene-isoprene block copolymer, the copolymer contains 10 to 40% copolymerized styrene.

Photopolymerizable ethylenically unsaturated crosslinking agents suitable for use in the invention include unsaturated esters of polyols, particularly such esters with alpha-methylene carboxylic acids, e.g. ethylene glycol diacrylate, diethylene glycol diacrylate, glycerol diacrylate, glycerol triacrylate, mannitol polyacrylate, sorbitol polyacrylate, ethylene glycol dimethacrylate, 1,3-propanediol dimethacrylate, 1,2,4-butanetriol trimethacrylate, 1,4-butanediol diacrylate and dimethacrylate, 1,4-cyclohexanediol diacrylate, 1,4-benzenediol dimethacrylate, isosorbidene diacrylate, pentaerythritol di-, tri-, and tetra-methacrylate, dipentaerythritol polyacrylate, pentaerythritol di-, tri-, and tetraacrylates, 1,3-propanediol diacrylate, 1,6-hexanediol diacrylate and dimethacrylate, 1,5-pentanediol dimethacrylate, trimethylolpropane triacrylate, the bisacrylates and methacrylates of polyethylene glycols of molecular weight 200 to 4000; unsaturated amides, particularly those of the alpha-methylene carboxylic acids, and especially those of alpha, omega-diamines and oxygen-interrupted omega-diamines such as methylene bisacrylamide, methylene bis-methacrylamide, ethylene bis-methacrylamide, 1,6-hexamethylene bis-acrylamide, diethylene triamine, tris-methacrylamide, 1,2-di(gammamethacrylamidopropoxy)ethane, beta-methacrylamidoethyl methacrylate, N-(beta-hydroxyethyl)-2-(methacrylamido) ethyl acrylate and N,N-bis(beta-methacrylyloxyethyl)-acrylamide; vinyl esters such as divinyl succinate, divinyl adipate, divinyl phthalate, divinyl terephthalate, divinyl benzene-1,3-disulfonate, divinyl butane-1,4-disulfonate and unsaturated aldehydes, such as sorbaldehyde (hexadienal). An outstanding class of those preferred addition polymerizable crosslinking agents are the esters and amides of alpha-methylene carboxylic acids and substituted carboxylic acids with polyols and polyamines wherein the molecular chain between the hydroxyls and amino groups is solely carbon or oxygen-interrupted carbon.

The useful addition polymerization and/or crosslinking initiators are those activatable by actinic light and thermally inactive at and below 185° C. These include aromatic ketones such as benzophenone and substituted benzophenones, the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone, alpha-sulfonic acid, 3-chloro-2-methylanthraquinone, retenequinone, 7,8,9,10-tetrahydronaphthacenequinone, and 1,2,3,4 tetrahydrobenz (a) anthracene-7,12-dione. Other photoinitiators which are also useful are described in U.S. Pat. No. 2,760,863 and include vicinal ketaldonyl compounds, such as diacetyl, benzil, etc.; α-ketaldonyl alcohols, such as benzoin, pivaloin, etc. acyloin ethers, e.g. benzoin methyl and ethyl ethers, etc., α-hydrocarbon substituted aromatic acyloins, including α-methylbenzoin, α-allylbenzoin and α-phenylbenzoin and 2,2 dialkoxy-2-phenylacetophenone.

The amount of elastomeric polymer blended with the CSM may range from 5 to 50% of the total elastomer content, with 10 to 30% being the preferred range. The amount of photopolymerizable ethylenically unsaturated crosslinking agent may range from 5 to 50 parts per hundred of the total elastomer content, with 10 to 20 being preferred. Similarly, the range for the photosensitizer would be 0.1 to 5 parts per hundred of elastomer, with 1 to 4 being preferred.

The photosensitive composition is prepared by mixing the elements either on an open mill or in an internal mixer for a time long enough to incorporate the ingredients homogeneously, usually several minutes. The composition is then compression molded or extruded to the desired thickness in sheet form. The sheet is exposed through a photographic transparency with a high intensity UV source for a time sufficient to cure the exposed areas leaving them solvent resistant. The unexpected areas are then removed by brushing or washing with solvents, leaving the exposed, insoluble CSM network as the relief plate image. The plate is then dried in a force air oven.

The supporting substrate for the photosensitive compound must be dimensionally stable and solvent resistant. Commonly used supports are sheet metals, such as aluminum, and plastics, such as polyester and polyamide.

The following examples illustrate the invention.

EXAMPLE 1

A formulation containing 100 parts Hypalon 40, 20 phr trimethylolpropane triacrylate (TMPTA), and 1.8 phr benzophenone was prepared by mixing the ingredients on a two roll mill at 200° F. for 30 minutes. The mix was then compression molded into a 6×6×0.070" plate with a 5 mil polyester support on one face. The plate was exposed 1 minute on the back and 8 minutes on the front through a transparency using a "black-light" exposure unit. The unexposed areas were removed with perchloroethylene solvent in a rotating brush wash unit. The plate was dried for 20 minutes in a 150° F. oven. The processed plate had good resolution, 0.031" relief, and a Shore A durometer of 61. No cracking of solid areas occurred when the plate was flexed 180° upon itself.

EXAMPLE 2

Using the same procedure as Example 1, a formulation containing 100 parts Hypalon 40, 20 phr 1,6-hexanediol diacrylate (HDDA), 1.8 phr benzophenone, and 2 phr silica filler was mixed for 12 minutes on the mill at 200° F. Face exposure was 12 minutes and back exposure was 1 minute. The processed plate had 0.030" relief, good resolution, a Shore A durometer of 56, and no cracking when flexed 180°.

EXAMPLE 3

Using the procedure in Example 1, a composition comprising a blend of 80 parts Hypalon 40 and 20 parts chlorinated polyethylene (Dow CM0136) in admixture with 10 phr TMPTA, 10 phr HDDA and 1.8 phr benzophenone was prepared. Mill temperature was 200° F., the face exposure was 10 minutes and back exposure was 1 minute. The plate had 0.034" relief, good resolution, a Shore A durometer of 70, and no cracking when flexed 180°.

EXAMPLE 4

A blend of 80 parts Hypalon 40, 20 parts natural rubber, (SMR5CV) 20 phr HDDA, 2 phr silica filler, and 1.8 phr benzophenone was prepared on the mill and formed into a plate as per Example 1. The face exposure was 14 minutes and back exposure was 1.5 minutes. The plate had 0.036" relief, good resolution, a Shore A durometer of 58, and no cracking when flexed 180°.

EXAMPLE 5

A plate comprising 100 parts Hypalon 40 with 10 phr TMPTA and 3.6 phr benzophenone was prepared according to the procedure of Example 1. The face exposure was 6 minutes, and back exposure was 2 minutes. The plate had 0.027" relief, good resolution, a Shore A durometer of 47, and no cracking when flexed 180°.

EXAMPLE 6

A blend of 50 parts Hypalon 40 and 50 parts of a block copolymer of styrene and isoprene (Kraton 1107 from Shell Chemical Co.) containing 10 phr HDDA and 2 phr 2,2-dimethoxy-2-phenylacetophenone (DMPAP) was prepared and formed into a plate according to the procedure described in Example 1. The face exposure was 8 minutes and back exposure was 30 seconds. The plate had 0.016" relief, good resolution, a Shore A durometer of 36, and no cracking when flexed 180°.

EXAMPLE 7

A blend of 50 parts Hypalon 40 and 50 parts of a block copolymer of styrene and butadiene, (Kraton 2104 from Shell Chemical Co.) 10 phr HDDA and 2 phr DMPAP was formed into a plate using the procedure described in Example 1. The face exposure was 8 minutes and back exposure was 15 seconds. The plate had 0.031" relief, good resolution, a Shore A durometer of 53 and no cracking when flexed 180°.

EXAMPLE 8

A blend of 50 parts Hypalon 40 and 50 parts of a butadieneacrylonitrile rubber containing 29.5% acrylonitrile, 10 phr HDDA and 2 phr DMPAP was formed into a plate using the procedure described in Example 1. The face exposure was 8 minutes and the back exposure was 15 seconds. The plate had 0.028" relief, good resolution, a Shore A durometer of 51 and no cracking when flexed 180°.

EXAMPLE 9

A blend of 50 parts Hypalon 40 and 50 parts polybutadiene rubber, 10 phr HDDA and 2 phr DMPAP was formed into a plate using the procedure described in Example 1. The face exposure was 4 minutes and back exposure was 15 seconds. The plate had 0.038" relief, good resolution, a Shore A durometer of 65 and no cracking when flexed 180°.

The following table shows the superior ink solvent resistance of chlorosulfonated polyethylene plates over leading commercial products.

| Sample | Percent volume change after 4 hours in: | | | |
|---|---|---|---|---|
| | Hexane | Cellosolve | n-Propanol | Ethyl Acetate |
| Cyrel (DuPont) | 284 | 3 | −1 | 86 |
| Flex-Light (Uniroyal) | −6 | 20 | 3 | 120 |
| Example 1 | −28 | 4 | 0 | 70 |
| Example 2 | −25 | 5 | 0 | 65 |

Hypalon offers better resistance to the solvents commonly used in printing inks than either of the leading flexographic photopolymer plates. In addition to superior solvent resistance, Hypalon plates show no cracking tendencies, good copy resolution, stability against post-curing, good color stability, and abrasion resistance.

What we claim and desire to protect by Letters Patent is:

1. An elastomeric article suitable for printing comprising (A) chlorosulfonated polyethylene (B) between about 5 and 50 phr of a photopolymerized cross-linking agent derived from a photopolymerizable ethylenically unsaturated compound and (C) between about 0.1 and 5 phr of a photoinitiator activatable by actinic radiation.

2. The elastomeric article defined in claim 1, wherein the chlorosulfonated polyethylene contains between about 25 and 43% of chlorine, and between about 1 and 1.5% of sulfur, said percentages being based upon the weight of said chlorosulfonated polyethylene.

3. The elastomeric article defined in claim 2 wherein said chlorosulfonated polyethylene has an ML-4 at 212° F. between about 30 and 77.

4. The elastomeric article defined in claim 3 wherein (A) is a blend of chlorosulfonated polyethylene with 5–50% of an elastomer selected from the group consisting of butadiene-acrylonitrile, butadiene-styrene, styrene-butadiene-styrene block copolymer, styrene-isoprene-styrene block copolymer, 1,4-polybutadiene, 1,2-polybutadiene, chlorinated polyethylene and natural rubber.

5. The elastomeric article defined in claim 4 wherein (A) is a blend of a chlorosulfonated polyethylene and 1,4-polybutadiene.

6. The elastomeric article defined in claim 4, wherein (A) is a blend of a chlorosulfonated polyethylene and 1,2-polybutadiene.

7. The elastomeric article defined in claim 4 wherein (A) is a blend of chlorosulfonated polyethylene and a butadiene-acrylonitrile copolymer containing 2–50% by weight of acrylonitrile.

8. The elastomeric article defined in claim 4 wherein (A) is a blend of chlorosulfonated polyethylene and a butadiene-acrylonitrile copolymer containing 20–40% by weight of acrylonitrile.

9. The elastomer article defined in claim 4 wherein (A) is a blend of chlorosulfonated polyethylene and a copolymer of butadiene and styrene.

10. The elastomeric article defined in claim 9 wherein (A) is a butadiene-styrene copolymer containing 21–45% by weight of co-polymerized styrene.

11. The elastomeric article defined in claim 4 wherein (A) is a blend of chlorosulfonated polyethylene and a styrene-butadiene-styrene block copolymer containing 10–40% by weight of copolymerized styrene.

12. The elastomeric article defined in claim 4 wherein (A) is a blend of chlorosulfonated polyethylene and a styrene-isoprene-styrene block copolymer containing 10–40% by weight of copolymerized styrene.

13. The elastomeric article defined in claim 4 wherein (B) is derived from an ester of acrylic acid.

14. The elastomeric article defined in claim 4 wherein (B) is derived from an ester of methacrylic acid.

15. The elastomeric article defined in claim 4 wherein (B) is derived from a photopolymerizable ethylenically unsaturated compound selected from the group consisting of ethylene glycol diacrylate, ethylene glycol dimethacrylate, diethylene glycol diacrylate, diethylene glycol dimethacrylate, 1,4-butanediol diacrylate, 1,4-butanediol dimethacrylate, 1,6-hexanediol diacrylate, 1,6-hexanediol dimethacrylate, trimethylolpropane triacrylate, trimethylolpropane trimethacrylate, or blends thereof.

16. The elastomeric article defined in claim 15 wherein (B) is derived from ethylene glycol diacrylate.

17. The elastomeric article defined in claim 15 wherein (B) is derived from ethylene glycol dimethacrylate.

18. The elastomeric article defined in claim 15 wherein (B) is derived from diethylene glycol diacrylate.

19. The elastomeric article defined in claim 15 wherein (B) is derived from diethylene glycol dimethacrylate.

20. The elastomeric article defined in claim 15 wherein (B) is derived from 1,4-butanediol diacrylate.

21. The elastomeric article defined in claim 15 wherein (B) is derived from 1,4-butanediol dimethacrylate.

22. The elastomeric article defined in claim 15 wherein (B) is derived from 1,6-hexanediol diacrylate.

23. The elastomeric article defined in claim 15 wherein (B) is derived from 1,6-hexanediol dimethacrylate.

24. The elastomeric article defined in claim 15 wherein (B) is derived from trimethylolpropane triacrylate.

25. The elastomeric article defined in claim 15 wherein (B) is derived from trimethylolpropane trimethacrylate.

26. The elastomeric article defined in claim 15 wherein (C) is benzophenone.

27. The elastomeric article defined in claim 15 wherein (C) is $C_1-C_5$ alkyl ethers of benzoin.

28. The elastomeric article defined in claim 15 wherein (C) is benzil.

29. The elastomeric article defined in claim 15 wherein (C) is $C_1-C_5$ alkyl monoketals of benzil.

30. The elastomeric article defined in claim 15 wherein (C) is 2,2-dimethoxy-2-phenylacetophenone.

31. the elastomeric article defined in claim 15 wherein (A) is chlorosulfonated polyethylene, (B) is 10–20 phr trimethylolpropane triacrylate and (C) is 0.1–5 phr benzophenone.

32. The elastomeric article defined in claim 15 wherein (A) is chlorosulfonated polyethylene, (B) is 10–20 phr, 1,6-hexanediol diacrylate or 1,6-hexanediol dimethacrylate or mixtures thereof, and (C) is 0.1–5 phr benzophenone.

33. The elastomeric article defined in claim 15 wherein (A) is a blend of chlorosulfonated polyethylene and chlorinated polyethylene, (B) is 10–20 phr, trimethylolpropane triacrylate, and (C) is 0.1–5 phr benzophenone.

34. The elastomeric article defined in claim 15 wherein (A) is a blend of chlorosulfonated polyethylene and natural rubber, (B) is 10–20 phr, 1,6-hexanediol diacrylate and (C) is 0.1–5 phr benzophenone.

35. The elastomeric article defined in claim 15 wherein (A) is a blend of chlorosulfonated polyethylene and a block copolymer of styrene-isoprene-styrene, (B) is 10–20 phr 1,6-hexanediol diacrylate and (C) is 0.1–5 phr 2,2-dimethoxy-2-phenylacetophenone.

36. The elastomeric article defined in claim 15 wherein (A) is a blend of chlorosulfonated polyethylene and a block copolymer of styrene-isoprene-styrene, (B) is 10–20 phr 1,6-hexanediol diacrylate and (C) is 0.1–5 phr 2,2-dimethoxy-2-phenylacetophenone.

37. The elastomeric article defined in claim 15 wherein (A) is a blend of chlorosulfonated polyethylene and a butadiene-acrylonitrile rubber, (B) is 10–20 phr 1,6-hexanediol diacrylate and (C) is b 0.1–5 phr 2,2 dimethoxy-2-phenylacetophenone.

38. The elastomeric article defined in claim 15 wherein (A) is a blend of chlorosulfonated polyethylene and polybutadiene rubber, (B) is 10–20 phr 1,6-hexanediol diacrylate and (C) is 0.1–5 phr 2,2 dimethoxy-2-phenylacetophenone.

39. The elastomeric article defined in claim 15 wherein (A) is a blend of chlorosulfonated polyethylene and chlorinated polyethylene, (B) is 10–20 phr 1,6-hexanediol diacrylate and (C) is 0.1–5 phr benzophenone.

* * * * *